US005854325A

United States Patent [19]

Hosomi et al.

[11] Patent Number: 5,854,325

[45] Date of Patent: Dec. 29, 1998

[54] PHOTOSENSITIVE ADHESIVE COMPOSITION FOR ADDITIVE PLATING

[75] Inventors: Takeshi Hosomi; Hiroshi Hayai; Takayuki Baba, all of Fujieda, Japan

[73] Assignee: Sumitomo Bakelite Company Limited, Tokyo, Japan

[21] Appl. No.: 811,026

[22] Filed: Mar. 4, 1997

[30] Foreign Application Priority Data

May 27, 1996 [JP] Japan .................................... 8-132390
Dec. 26, 1996 [JP] Japan .................................... 8-347161

[51] Int. Cl.[6] ...................................................... C08K 3/26

[52] U.S. Cl. .......................... 524/425; 524/436; 524/442; 524/509

[58] Field of Search .................................... 524/425, 436, 524/442, 509

[56] References Cited

FOREIGN PATENT DOCUMENTS 63-010752 3/1988 Japan .
63-297571 12/1988 Japan .
64-029479 1/1989 Japan .
64-047095 2/1989 Japan .
01-253730 10/1989 Japan .
03-018096 1/1991 Japan .
04-079610 12/1992 Japan .
05-136575 6/1993 Japan .
07-049464 5/1995 Japan .

*Primary Examiner*—Edward J. Cain
*Attorney, Agent, or Firm*—Browdy and Neimark

[57] ABSTRACT

The present invention provides a photosensitive adhesive composition for additive plating, comprising the following components (a), (b), (c), (d), (e) and (f) as essential components; and an excellent multilayer printed circuit board obtained by using the adhesive composition:

(a) a polyfunctional epoxy resin having an epoxy equivalent of 120–500, (b) a modified phenol novolac obtained by reacting 20–60 mole % of the phenolic hydroxyl groups of a phenol novolac obtained by condensing a phenol compound with formaldehyde in the presence of an acidic catalyst, with a glycidyl group-containing acrylate or methacrylate, (c) an epoxy acrylate or epoxy methacrylate compound, (d) a diluent consisting of a polyfunctional monomer having a plurality of photosensitive functional groups or a polyfunctional monomer having a photosensitive functional group and a heat-sensitive functional group, or a diluent consisting of a combination of the two monomers, (e) a photopolymerization initiator, and (f) an acid-soluble filler.

23 Claims, 1 Drawing Sheet

PHOTOSENSITIVE ADHESIVE COMPOSITION FOR ADDITIVE PLATING

BACKGROUND OF THE INVENTION

1. Field of the Invention

The present invention relates to a photosensitive adhesive composition for additive plating, as well as to a photosensitive adhesive film for additive plating, for use in production of a multilayer printed circuit board by a build-up process using the composition or film.

2. Related Art Statement

A conventional process for production of a multilayer printed circuit board comprises forming a circuit in a both-side-copper-clad substrate by etching; roughening the surface of the circuit; laminating thereon at least one prepreg sheet obtained by impregnating a glass cloth with an epoxy resin and half-curing the resulting glass cloth; further laminating thereon a copper foil or a one-side-copper-clad substrate; and heat-pressing the resulting material to obtain a multilayer printed circuit board. This process has needed a very large facility and a long time because of (1) impregnation of glass cloth with epoxy resin and subsequent half-curing for production of prepreg sheet and (2) heat- and pressure-molding using a press. Furthermore, in the process, many kinds of prepregs different in resin content and melting behavior must be prepared to control the thickness between the circuit layers, because the proportion of remaining copper foil in an inner layer circuit substrate differs in each production of the multilayer printed circuit board, and it has been difficult to make very small the thickness between the circuit layers, because the prepreg sheet is made of a glass cloth.

In order to solve the above problems, a number of techniques using an insulating layer containing no glass cloth have been reported recently. For example, there are techniques using a thermosetting epoxy resin coating agent or film, a polyimide resin coating agent or film, a thermoplastic resin heat-resistant film, or a photocuring epoxy resin film.

In recent years, for production of a multilayer printed circuit board of higher density, smaller size and lighter weight, it has become necessary not only to make the circuit pattern finer but also to make surface via holes enabling electrical conduction between circuit layers. The surface via holes, when made by mechanical drilling, can have a diameter as small as about 300 $\mu$m but, when holes of smaller diameter are made thereby, there arise problems in accuracy of hole position, life of a drill, etc.

In a conventional method of making surface via holes by impregnating a glass cloth with an epoxy resin, half-curing the resulting glass cloth to obtain a prepreg, subjecting the prepreg to heat- and pressure-curing together with a copper foil, subjecting the resulting material to etching to form a circuit, and conducting mechanical drilling, there are problems, for example, (1) use of glass cloth incurs a high cost and makes it impossible to obtain a very small thickness and (2) formation of surface via holes by mechanical drilling makes it impossible to obtain a fine pattern.

In order to solve these problems, studies are being made on a photo build-up method which comprises forming, on both sides or one side of an inner layer circuit substrate, a photosensitive insulating resin layer containing no glass cloth, making fine surface via holes by photo imaging, and applying panel plating and etching to form a circuit. The photosensitive insulating resin must have excellent developability by photoengraving and properties required for additive plating adhesive.

In production of substrates for home or personal use by additive plating process, thermosetting type adhesives for additive plating are in general and wide use. In, for example, JP-B-63-10752, JP-A-63-297571, JP-A-64-47095 and JP-A-3-18096, there is a description on the roughening of adhesive layer with oxidizing agent. The roughening comprises eluting a rubber component (e.g. acrylonitrile-butadiene rubber) contained in an adhesive, with an oxidizing agent consisting of an aqueous chromic acid mixture to roughen the surface of the adhesive.

The roughening of adhesive layer is also described in other literatures. In JP-B-4-79160, an inorganic fine powder (e.g. silica or calcium carbonate) is dispersed in a highly heat-resistant resin matrix (e.g. epoxy resin, phenolic resin or melamine resin) to prepare an adhesive; the inorganic fine powder in the adhesive is selectively eluted with a particular chemical reagent; thereby, the surface of the adhesive layer is roughened. In JP-A-1-29479, a cured epoxy resin fine powder is dispersed in an epoxy resin matrix, and the cured epoxy resin fine powder is selectively eluted with an oxidizing agent (the powder and the matrix have different solubilities in the oxidizing agent). When such thermosetting type adhesives for additive plating are used, however, it is impossible to form surface via holes by photo imaging.

Meanwhile, formation of surface via holes by photo imaging is described in JP-A-5-136575(wherein an epoxy resin is used as a matrix and a cationic photo-polymerization initiator is used as a curing agent for the matrix) and in JP-A-1-253730(wherein an acrylate-modified phenol novolac type epoxy resin or an acrylate-modified cresol novolac type epoxy resin is used as a matrix). In this approach, however, an organic solvent must be used as a developer, which is not desirable from the standpoint of operational environment.

To satisfy the above property requirements for adhesive, there are reported, in, for example, JP-B-7-49464, curable compositions each comprising a compound having, in the molecule, a phenolic hydroxyl group and a (meth)acryloyl group, an epoxy compound and a photo-polymerization initiator and capable of giving rise to a photoreaction and a thermal reaction. In these curable compositions, however, since the compound having, in the molecule, a phenolic hydroxyl group and a (meth)acryloyl group has a small molecular weight and since the contrast which is a balance between dissolution rate and photo-sensitivity, is small when alkali development with an aqueous sodium hydroxide solution is employed, there takes place overexposure caused by halation or surface deterioration caused by developer, in development of high resolution although there is no such problem in development of low resolution.

OBJECT OF THE INVENTION

The objects of the present invention are to provide a photosensitive adhesive composition for additive plating, which enables, by photo imaging, formation of via holes of high accuracy by using an aqueous alkali solution as a developer, which has high resistance to plating solution in electroless plating, whose roughened surface has sufficient adhesivity to copper plating, which is heat-resistant even at a temperature of about 260° C. employed in soldering, and which shows excellent insulation; and to provide a photosensitive adhesive or adhesive film for additive plating, for use in production of a multilayer printed circuit board by using the above composition.

SUMMARY OF THE INVENTION

In order to achieve the above objects, the present invention provides a photosensitive adhesive composition for additive plating, allowing easy formation of photo via holes and having excellent heat resistance, and a photosensitive adhesive film for additive plating, for use in production of a multilayer printed circuit board by using the adhesive composition.

The photosensitive adhesive composition for additive plating according to the present invention comprises the following components (a), (b), (c), (d), (e) and (f) as essential components:

(a) a polyfunctional epoxy resin having an epoxy equivalent of 120–500, (b) a modified phenol novolac obtained by reacting 20–60 mole % of the phenolic hydroxyl groups of a phenol novolac obtained by condensing a phenol compound with formaldehyde in the presence of an acidic catalyst, with a glycidyl group-containing acrylate or methacrylate, (c) an epoxy acrylate or epoxy methacrylate compound, (d) a diluent consisting of a polyfunctional monomer having a plurality of photosensitive functional groups or a polyfunctional monomer having a photo-sensitive functional group and a heat-sensitive functional group, or a diluent consisting of a combination of the two monomers, (e) a photopolymerization initiator, and (f) an acid-soluble filler.

Also, the photosensitive adhesive composition for additive plating according to the present invention comprises the following components (a), (b), (c), (d), (e) and (f) as essential components:

(a) a polyfunctional epoxy resin having an epoxy equivalent of 120–500, (b) a modified bisphenol novolac obtained by reacting 20–60 mole % of the phenolic hydroxyl groups of a bisphenol novolac obtained by condensing bisphenol A or F with formaldehyde in the presence of an acidic catalyst, with a glycidyl group-containing acrylate or methacrylate, (c) an epoxy acrylate or epoxy methacrylate compound, (d) a diluent consisting of a polyfunctional monomer having a plurality of photosensitive functional groups or a polyfunctional monomer having a photosensitive functional group and a heat-sensitive functional group, or a diluent consisting of a combination of the two monomers, (e) a photopolymerization initiator, and (f) an acid-soluble filler.

DETAILED DESCRIPTION OF THE INVENTION

Figure 1A:
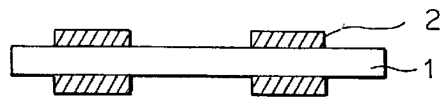
FIGS. 1A to 1I are schematic sectional views showing the production steps of a multilayer printed circuit board using the photosensitive adhesive composition or film for additive plating according to the present invention. In these figures, 1 refers to an inner layer circuit substrate; 2 refers to an inner layer copper foil; 3 refers to a roughened circuit surface; 4 refers to a photosensitive adhesive composition for additive plating; 5 refers to a photosensitive adhesive film for additive plating; 6 refers to a photo via hole; 7 refers to a roughened adhesive surface; 8 refers to copper plating; 9 refers to an etching resist; and 10 refers to a circuit.

The epoxy resin as the component (a) used in the present invention is preferably a bisphenol A or F type epoxy resin. Its number-average molecular weight is preferably 1,000 or smaller, because when the number-average molecular weight is larger than 1,000, the resulting adhesive composition has inferior developability with an aqueous alkali solution.

The modified phenol novolac as the component (b) can be obtained by reacting a phenol novolac (obtained by condensing a phenol compound having one or more phenolic hydroxyl groups in the molecule, with formaldehyde in the presence of an acidic catalyst) with a glycidyl group-containing acrylate or methacrylate. In order to obtain an adhesive composition having excellent alkali developability after photopolymerization and excellent pattern accuracy, it is appropriate to use the glycidyl group-containing acrylate or methacrylate in an amount of 0.2–0.6 epoxy group equivalent per equivalent of the hydroxyl group of the phenol novolac. When the epoxy group equivalent is less than 0.2, the resulting adhesive composition has low photopolymerizability and the composition after photopolymerization with an ultraviolet light dissolves in a developer, making it impossible to obtain the intended resolution. When the epoxy group equivalent is more than 0.6, the resulting adhesive composition has low alkali solubility and is insoluble in developer even before photopolymerization, making it impossible to obtain the intended resolution as well. In order to increase the contrast of solubility in aqueous alkali solution as a result of photopolymerization and achieve high resolution, it is necessary to react 20–60 mole %, preferably 40–50 mole % of the phenolic hydroxyl groups of the phenol novolac with a glycidyl group-containing acrylate or methacrylate.

In order to increase the contrast of development, it is preferable to use a modified bisphenol novolac obtained by reacting 20–60 mole % of the phenolic hydroxyl groups of a bisphenol novolac (obtained by condensing bisphenol A or F having two phenolic hydroxyl groups in the molecule, with formaldehyde in the presence of an acidic catalyst), with a glycidyl group-containing acrylate or methacrylate. Such a modified bisphenol novolac is preferred because the novolac, although it has a higher molecular weight, gives small change in dissolution rate and can have high sensitivity in development. The reason is not made clear but is presumed to be that the intramolecular movement of the bisphenol novolac is restrained and it reduces the cohesion of hydrophilic groups or hydrophobic groups due to the higher molecular weight. The bisphenol compound having two phenolic hydroxyl groups in the molecule includes bisphenol S, etc., besides bisphenol A or F. The glycidyl group-containing acrylate or methacrylate is preferably glycidyl acrylate or glycidyl methacrylate in view of the reactivity, availability, etc.

An alkyl- or alkenylphenol novolac is also usable as the starting material for the component (b). In this case, the alkyl or alkenyl group preferably has about 1–4 carbon atoms, and examples thereof are methyl group, ethyl group, n-propyl group, isopropyl group, n-butyl group, sec-butyl group, tert-butyl group and allyl group. An alkyl or alkenyl group having 5 or more carbon atoms is not preferred because of higher hydrophobicity and lower alkali developability.

Component (b) is used preferably in an amount of 0.9–1.1 equivalents of phenolic hydroxyl group of component (b) per equivalent of glycidyl group of component (a). Use outside the range reduces heat resistance after moistened and chemical resistance of the resulting final product.

The epoxy acrylate or epoxy methacrylate compound as the component (c) has no particular restriction as to the type.

It can be obtained by reacting an epoxy compound (e.g. bisphenol A type epoxy compound, bisphenol F type epoxy compound, bisphenol S type epoxy compound, phenol novolac type epoxy compound, cresol novolac type epoxy compound or aliphatic epoxy compound) with acrylic acid or methacrylic acid. When higher solubility in aqueous alkali solution or higher adhesion to insulating substrate or metal is desired, the component (c) may be obtained by one of the following processes.

(1) The above reaction product between an epoxy compound and acrylic acid or methacrylic acid is reacted with a dicarboxylic acid compound having an acid value of 5–100, such as oxalic acid, malonic acid, succinic acid, glutamic acid, adipic acid, maleic acid, fumaric acid, phthalic acid, terephthalic acid or the like, or with an anhydride thereof.

(2) In the above reaction between an epoxy compound and acrylic acid or methacrylic acid, the epoxy group of the epoxy compound is allowed to remain unreacted in an amount necessary for later modification with dicarboxylic acid, and the resulting reaction product is reacted with a dicarboxylic acid compound having an acid value of 5–100, such as oxalic acid, malonic acid, succinic acid, glutamic acid, adipic acid, maleic acid, fumaric acid, phthalic acid, terephthalic acid or the like, or with an anhydride thereof. In the above processes, use of a dicarboxylic acid compound having an acid value lower than 5 gives an adhesive composition of low solubility in aqueous alkali solution; use of a dicarboxylic acid compound having an acid value higher than 100 gives an adhesive composition having inferior resist properties in chemical resistance, electrical property, etc. when cured.

Component (c) is used preferably in an amount of 5–20 weight % based on the total weight of components (a) to (d) in view of developability.

The diluent consisting of a polyfunctional monomer having a plurality of photosensitive functional groups, as the component (d) includes compounds having at least two acryloyl or methacryloyl groups in the molecule, for example, ethylene glycol diacrylate, ethylene glycol dimethacrylate, diethylene glycol diacrylate, diethylene glycol dimethacrylate, 1,4-butanediol diacrylate, 1,4-butanediol dimethacrylate, 1,3-butanediol diacrylate, 1,3-butanediol dimethacrylate, 1,6-hexanediol diacrylate, 1,6-hexanediol dimethacrylate, glycerol diacrylate, neopentyl glycol diacrylate, bisphenol A diacrylate, trimethylolpropane triacrylate, pentaerythritol triacrylate and pentaerythritol tetraacrylate. Of these, preferred are trimethylolpropane triacrylate, pentaerythritol triacrylate and pentaerythritol tetraacrylate, all of which are tri- or tetrafunctional and have excellent resistance to developer after photopolymerization.

The diluent consisting of a polyfunctional monomer having a photosensitive functional group and a heat-sensitive functional group, also as the component (d) includes acrylate or methacrylate compounds having at least one hydroxyl group in the molecule, for example, hydroxyethyl acrylate, hydroxyethyl methacrylate, hydroxypropyl acrylate, hydroxypropyl methacrylate, hydroxybutyl acrylate, hydroxybutyl methacrylate, butanediol monoacrylate, glycerol methacrylate, phenoxyhydroxypropyl acrylate, polyethylene glycol acrylate, polyethylene glycol methacrylate and glycerol dimethacrylate. There can also be used glycidyl acrylate and glycidyl methacrylate both having a glycidyl group.

These polyfunctional monomers having a plurality of photosensitive groups are high in velocity of photoreaction and allow photopolymerization even to the deep place at a low energy irradiation; therefore, high resolution is possible, there is no deterioration by developer at the photopolymerized portions, and even in the photo via holes of high aspect ratio, the sides after development are linear and undercut, etc. can be prevented.

The acrylate or methacrylate compound having at least one hydroxyl group in the molecule is water-soluble owing to its hydroxyl group and can give a higher contrast in the development with aqueous alkali solution.

When there is required higher chemical resistance after heat-curing, there can be used glycidyl acrylate or glycidyl methacrylate both capable of reacting with a carboxyl group or phenolic hydroxyl group.

These polyfunctional monomers can be used singly or in combination, and the amounts used can be determined from the balance of developability and properties after curing.

Component (d) is used preferably in an amount of 1–15 weight % based on the total weight of components (a) to (d).

The photopolymerization initiator as the component (e) includes, for example, benzophenones such as benzophenone, benzoylbenzoic acid, 4-phenylbenzophenone, hydroxybenzophenone and the like; benzoin; benzoin alkyl ethers such as benzoin ethyl ether, benzoin isopropyl ether, benzoin butyl ether, benzoin isobutyl ether, benzyl dimethyl ketal and the like; acetophenones such as 4-phenoxy-dichloroacetophenone, 4-t-butyl-dichloroacetophenone, 4-t-butyl-trichloroacetophenone, diethoxyacetophenone and the like; thioxanthones such as thioxanthone, 2-chlorothioxanthone, 2-methylthioxanthone, 2,4-dimethylthioxanthone and the like; and alkylanthraquinones such as ethylanthraquinone, butylanthraquinone and the like. These compounds can be used singly or in admixture of two or more compounds. The amount of the photopolymerization initiator used is generally 0.1–10% by weight based on the composition.

The acid-soluble filler (f) includes calcium silicate, magnesium hydroxide, calcium carbonate, etc. with calcium carbonate being preferred. The filler (f) is used in an amount of preferably 20–50 parts by weight per 100 parts by weight of the total of the components (a) to (d). When the amount of the filler (f) used is less than 20 parts by weight, the cured surface of the adhesive has an insufficient number of dents after dissolution of the acid-soluble filler (f) with an acid and is not roughened satisfactorily; therefore, the adhesive surface has low adhesivity with copper plating. When the amount of the filler (f) is more than 50 parts by weight, the adhesivity of the adhesive with copper plating does not increase proportionally and the light transmittance of the adhesive decreases.

The adhesive composition of the present invention comprises, if necessary, an organic solvent. The organic solvent includes ketones such as methyl ethyl ketone, cyclohexanone and the like; aromatic hydrocarbons such as toluene, xylene, tetramethylbenzene and the like; cellosolves such as methyl cellosolve, ethyl cellosolve, butyl cellosolve and the like; carbitols such as methylcarbitol, butylcarbitol and the like; glycol ethers such as propylene glycol monomethyl ether, propylene glycol dimethyl ether, dipropylene glycol monoethyl ether, triethylene glycol monoethyl ether and the like; acetic acid esters such as ethyl acetate, butyl acetate, cellosolve acetate, butyl cellosolve acetate, carbitol acetate, butyl carbitol acetate and the like; and so forth. These solvents may be used singly or in combination of two or more solvents. The organic solvent is used for the purposes of (1) dissolving the component (b) which is a solid modified phenol novolac, (2) enabling coating of liquid adhesive composition on inner layer circuit substrate, heating and drying of the coated composition (the solvent in the composition is evaporated), and resultant formation of tack-free film, and (3) allowing the adhesive composition to have an appropriate viscosity so that the composition can be coated on a carrier film and, by solvent vaporization, be made into a dry film.

When the adhesive composition of the present invention is irradiated with an ultraviolet light, the photopolymerization initiator (e) generates a radical; the radical reacts with the acryloyl and/or methacryloyl groups possessed by the components (b), (c) and (d); and polymerization takes place between the resulting groups. In subsequent heating of the composition, the glycidyl group of the component (a) and the phenolic hydroxyl group of the component (b) are polymerized to give rise to curing. At this time, when the component (d) has a hydroxyl group or the component (c) has a carboxyl group, the hydroxyl group or the carboxyl group reacts with the glycidyl group of the component (a). When the component (d) has a glycidyl group, the glycidyl group reacts with the phenolic hydroxyl group of the component (b).

The photosensitive adhesive composition for additive plating according to the present invention can further comprise, as necessary, an ultraviolet absorber and a thermal polymerization inhibitor both for storage stability, a plasticizer, etc. The composition may also comprise, besides the acid-soluble filler, an inorganic filler such as silica, talc, clay, barium sulfate, aluminum hydroxide, zinc oxide or the like.

The present photosensitive adhesive composition for additive plating, comprising the above-mentioned components has high resolution and is superior in developability with aqueous alkali solution. The solubility of the adhesive composition in aqueous alkali solution is given mainly by the remaining phenolic hydroxyl group of the modified phenol novolac (b) and is higher when the epoxy acrylate or methacrylate compound (c) has a carboxyl group. As mentioned previously, the photopolymerization products wherein these functional groups remain, are insufficient in alkali resistance, chemical resistance, electrical properties, etc. However, the present photosensitive adhesive composition for additive plating is photopolymerized and, after development, is heat-cured; in this heat-curing, the epoxy resin (a) causes a heat-curing reaction with the phenolic hydroxyl group of the component (b) and the carboxyl group of the component (c) or the hydroxyl group of the component (d), and in some cases the glycidyl group of the component (d) reacts with the phenolic hydroxyl group of the component (b), to form a main skeleton having excellent properties. Therefore, the present adhesive composition can give a cured adhesive product which withstands long-term electroless plating conducted under high-temperature and highly alkaline conditions and which has excellent adhesivity with copper plating.

Next, description is made in detail on a specific example of the process of production of a multilayer printed circuit board using the above-mentioned photosensitive adhesive composition for additive plating, with referring to FIGS. 1A to 1I.

Figure 1B:
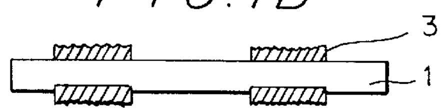
Figure 1C:
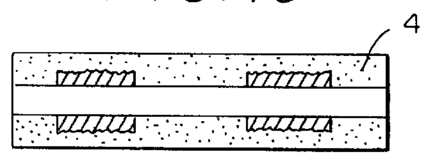

First, the surface of the circuit copper foil (2) of an inner layer circuit substrate (1) subjected to patterning is roughened with a chemical reagent in a conventional manner (FIG. 1A and Fig. 1B). (Alternatively, an inner layer circuit substrate having a roughened copper foil thereon may be used.) Then, on the whole surface of the resulting material is coated a photosensitive adhesive composition (4) for additive plating, using screen printing, a curtain coater, a roller coater or the like (FIG. 1C). A heat treatment is applied until the composition (4) is dried and becomes tack-free. Thereafter, a negative film is attached onto the tack-free composition (4), and an ultraviolet light is applied. Then, the unexposed portion of the composition is dissolved by development with an aqueous alkali solution to form photo via holes (FIG. 1E).

Figure 1D:
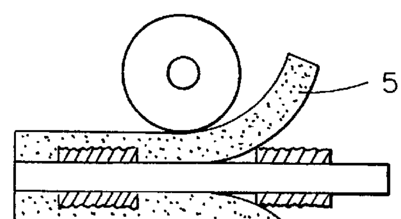
Figure 1E:
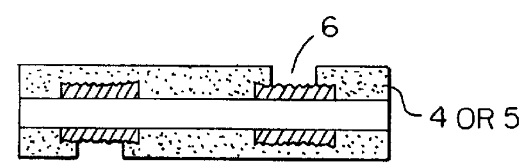

When a photosensitive adhesive film (5) for additive plating is used, the film (5) is laminated on the inner layer circuit substrate using a roll laminator (FIG. 1D). In this case, when air bubbles are taken into because of the unevenness present on the surface of inner layer circuit substrate, a vacuum laminator may be used. Thereafter, a negative film is attached onto the film (5), and an ultraviolet light is applied. Then, the unexposed portion of the film is dissolved by development with an aqueous alkali solution to form photo via holes (FIG. 1E).

Figure 1F:
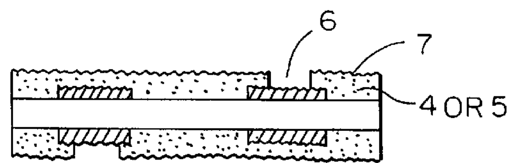

Next, the photosensitive adhesive is heat-treated and cured. The surface of the cured photosensitive adhesive is polished mechanically to make the surface smooth as well as to expose the acid-soluble filler on the surface. The acid-soluble filler exposed is dissolved in an aqueous acidic solution to form large dents in the surface of the adhesive. The aqueous acidic solution includes an aqueous solution of hydrochloric acid, sulfuric acid or the like. The resin of the photo-sensitive adhesive is chemically roughened with an oxidizing agent to form fine dents in the surface of the adhesive (FIG. 1F). The oxidizing agent includes an aqueous chromic acid mixture, an aqueous potassium permanganate solution, etc.

Figure 1G:
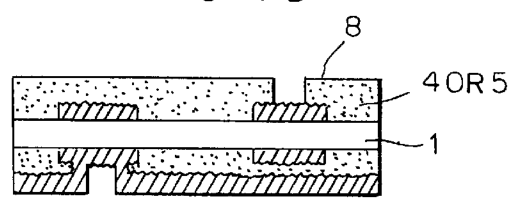
Figure 1H:
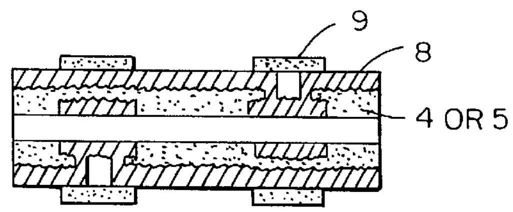
Figure 1I:
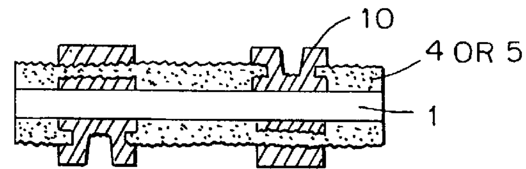

Next, a catalyzer is adhered onto the surface of the roughened surface of the photosensitive adhesive and electroless plating is conducted on the surface, according to a known method (FIG. 1G). In this case, electroplating may be conducted after the electroless plating, to form copper plating. Thereafter, if necessary, an etching resist (9) is applied (FIG. 1H) and etching is conducted to form via holes and a circuit (10) (FIG. 1I).

DESCRIPTION OF PREFERRED EMBODIMENTS

The present invention is hereinafter described in detail with reference to Examples.

SYNTHESIS EXAMPLE 1

Synthesis of methacryloyl group-containing phenol novolac

In a 2-liter flask was placed, as a phenol novolac, 700 g (OH: about 4 equivalents) of Phenolite TD-2090-60M (a methyl ethyl ketone solution having a non-volatile content of 60%, manufactured by Dainippon Ink and Chemicals, Incorporated). Thereto were added 0.2 g of hydroquinone and 284 g (2 moles) of glycidyl methacrylate. The flask contents were heated to 110° C. Thereto was added 1 g of tributylamine. The resulting mixture was stirred at 110° C. for 5 hours to give rise to a reaction.

SYNTHESIS EXAMPLE 2

Synthesis of methacryloyl group-containing phenol novolac

In a 2-liter flask was placed, as a phenol novolac, 700 g (OH: about 4 equivalents) of Phenolite TD-2090-60M. Thereto were added 0.2 g of hydroquinone and 398 g (2.8 moles) of glycidyl methacrylate. The flask contents were heated to 110° C. Thereto was added 1 g of tributylamine. The resulting mixture was stirred at 110° C. for 5 hours to give rise to a reaction.

SYNTHESIS EXAMPLE 3

Synthesis of methacryloyl group-containing bisphenol A novolac

In a 2-liter flask was placed, as a bisphenol A novolac, 800 g (OH: about 4 equivalents) of Phenolite LF-4871 (a methyl ethyl ketone solution having a nonvolatile content of 60%, manufactured by Dainippon Ink and Chemicals, Incorporated). Thereto were added 0.2 g of hydroquinone and 284 g (2 moles) of glycidyl methacrylate. The flask contents were heated to 110° C. Thereto was added 1 g of tributylamine. The resulting mixture was stirred at 110° C. for 5 hours to give rise to a reaction.

SYNTHESIS EXAMPLE 4

Synthesis of methacryloyl group-containing bisphenol A novolac

In a 2-liter flask was placed, as a bisphenol A novolac, 800 g (OH: about 4 equivalents) of Phenolite LF-4871. Thereto were added 0.2 g of hydroquinone and 398 g (2.8 moles) of glycidyl methacrylate. The flask contents were heated to 110° C. Thereto was added 1 g of tributylamine. The resulting mixture was stirred at 110° C. for 5 hours to give rise to a reaction.

SYNTHESIS EXAMPLE 5

Synthesis of carboxyl group-containing epoxy acrylate

In a 2-liter flask were placed 760 g (4 equivalents) of Epikote 828 (a bisphenol A type epoxy resin having an epoxy equivalent of 190, manufactured by Yuka Shell Epoxy K. K.) and 1 g of methoxyphenol as a polymerization inhibitor. Thereto were added 288 g (4 moles) of acrylic acid and 1 g of benzyldimethylamine. The resulting mixture was stirred at 100° C. for 6 hours to give rise to a reaction. Thereto was added 160 g (1.6 moles) of succinic anhydride, followed by stirring at 80° C. for 3 hours to give rise to a reaction.

EXAMPLE 1

There were mixed 100 parts by weight of the methacryloyl group-containing phenol novolac of Synthesis Example 1, 15 parts by weight of the carboxyl group-containing epoxy acrylate of Synthesis Example 5, 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 (manufactured by Ciba Geigy Co.) as a photopolymerization initiator and 0.2 part by weight of triphenyl-phosphine as a heat-curing accelerator. The resulting mixture was thoroughly stirred to obtain a photosensitive adhesive composition for additive plating.

EXAMPLE 2

There were mixed 100 parts by weight of the methacryloyl group-containing phenol novolac of Synthesis Example 1, 15 parts by weight of Epoxy Acrylate SP-4010 (a reaction product between phenol novolac type epoxy compound and acrylic acid, manufactured by Showa Highpolymer Co., Ltd.), 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 3

There were mixed 100 parts by weight of the methacryloyl group-containing bisphenol A novolac of Synthesis Example 3, 15 parts by weight of the carboxyl group-containing epoxy acrylate of Synthesis Example 5, 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 4

There were mixed 100 parts by weight of the methacryloyl group-containing bisphenol A novolac of Synthesis Example 3, 15 parts by weight of Epoxy Acrylate SP-4010, 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 5

There were mixed 100 parts by weight of the methacryloyl group-containing phenol novolac of Synthesis Example 1, 15 parts by weight of the carboxyl group-containing epoxy acrylate of Synthesis Example 5, 10 parts by weight of hydroxyethyl methacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 6

There were mixed 100 parts by weight of the methacryloyl group-containing phenol novolac of Synthesis Example 1, 15 parts by weight of the carboxyl group-containing epoxy acrylate of Synthesis Example 5, 10 parts by weight of glycidyl methacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 7

There were mixed 100 parts by weight of the methacryloyl group-containing bisphenol A novolac of Synthesis Example 3, 15 parts by weight of the carboxyl group-containing epoxy acrylate of Synthesis Example 5, 10 parts by weight of hydroxyethyl methacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 8

There were mixed 100 parts by weight of the methacryloyl group-containing bisphenol A novolac of Synthesis Example 3, 15 parts by weight of the carboxyl group-containing epoxy acrylate of Synthesis Example 5, 10 parts by weight of glycidyl methacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

EXAMPLE 9

The photosensitive adhesive composition for additive plating obtained in Example 3 was coated on a PET film having a thickness of 25 μm and dried at 80° C. for 20 minutes to obtain a photosensitive adhesive film of 70 μm thickness for additive plating.

EXAMPLE 10

The photosensitive adhesive composition for additive plating obtained in Example 4 was coated on a PET film having a thickness of 25 μm and dried at 80° C. for 20 minutes to obtain a photosensitive adhesive film of 70 μm thickness for additive plating.

Comparative Example 1

There were mixed 100 parts by weight of the carboxyl group-containing epoxy acrylate of Synthesis Example 5, 20 parts by weight of pentaerythritol triacrylate and 30 parts by weight of calcium carbonate. They were kneaded in a three-roll mill. Thereto was added 5 parts by weight of Irgacure 651 as a photopolymerization initiator to obtain a photosensitive adhesive composition for additive plating.

Comparative Example 2

There were mixed 100 parts by weight of the methacryloyl group-containing phenol novolac of Synthesis Example 2, 15 parts by weight of the carboxyl group-containing epoxy acrylate of Synthesis Example 5, 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

Comparative Example 3

There were mixed 100 parts by weight of the methacryloyl group-containing bisphenol A novolac of Synthesis Example 4, 15 parts by weight of the carboxyl group-containing epoxy acrylate of Synthesis Example 5, 10 parts by weight of pentaerythritol triacrylate, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

Comparative Example 4

There were mixed 100 parts by weight of the methacryloyl group-containing phenol novolac of Synthesis Example 1, 15 parts by weight of the carboxyl group-containing epoxy acrylate of Synthesis Example 5, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

Comparative Example 5

There were mixed 100 parts by weight of the methacryloyl group-containing bisphenol A novolac of Synthesis Example 3, 15 parts by weight of the carboxyl group-containing epoxy acrylate of Synthesis Example 5, 25 parts by weight of Epikote 828 and 30 parts by weight of calcium carbonate. They were kneaded in a three-roll mill. Thereto were added 5 parts by weight of Irgacure 651 as a photopolymerization initiator and 0.2 part by weight of triphenylphosphine as a heat-curing accelerator. The resulting mixture was thoroughly stirred to obtain a photosensitive adhesive composition for additive plating.

Production of multilayer printed circuit boards by additive plating process

Each of the photosensitive adhesive compositions for additive plating, obtained in Examples 1–8 and Comparative Examples 1–5 was coated on an inner layer circuit substrate having thereon a surface-roughened circuit copper foil and was heat-treated at 80° C. for 20 minutes. Only in the case of the composition of Comparative Example 1, since the coated composition was tacky even after the heat-treatment, a cover film capable of transmitting an ultraviolet light was placed on the composition. All the compositions after heat treatment had a thickness of 70 μm. Each of the photosensitive adhesive films (having a thickness of 70 μm) obtained in Examples 9 and 10 was roll-laminated on the same substrate as used above. On each of the inner layer circuit substrates provided with the adhesive layers thereon was placed a pattern for via holes (100 μmϕ), and light exposure was conducted on the pattern at a dose of 200 mJ/$cm^2$ using a high-pressure mercury lamp aligner. Then, development was conducted with a 1.5% aqueous sodium hydroxide solution of 25 ° C. by spraying the solution at a pressure of 2 kg/$cm^2$. After water-washing and drying, post-exposure was conducted on the whole surface of the resulting material at a dose of 1 J/$cm^2$. Thereafter, a heat-treatment was applied at 150° C. for 60 minutes. The surface of the cured adhesive was polished with a buff, followed by immersion in a 4% aqueous sulfuric acid solution for 3 minutes, immersion in an aqueous potassium permanganate solution at 80° C. for 10 minutes, and neutralization, to roughen the surface of the adhesive. Next, steps of degreasing, addition of a catalyst and activation were conducted. The resulting material was dipped in an electroless copper plating solution (KC-500 manufactured by Japan Energy Corporation) at 70° C. for 5 hours to form a copper film of about 25 μm in thickness, followed by drying at 150° C. for 60 minutes to obtain a multilayer printed circuit board.

The properties of photosensitive adhesives for additive plating, shown during the above process for production of multilayer printed circuit boards by additive process were examined by the following test methods. The results are shown in Table 1.

TABLE 1

| | Dissolution Time (sec) | Step number | Via hole sectional shape | Soldering heat resistance after moistened (sec) | Peeling strength (KN/cm) |
|---|---|---|---|---|---|
| Ex. 1 | 70 | 4 | Tapered | 20 | 1.1 |
| Ex. 2 | 75 | 5 | Tapered | 20 | 1.2 |
| Ex. 3 | 70 | 5 | Tapered | 20 | 1.0 |
| Ex. 4 | 90 | 6 | Tapered | 20 | 1.2 |
| Ex. 5 | 60 | 4 | Tapered | 20 | 1.1 |
| Ex. 6 | 65 | 5 | Tapered | 20 | 1.3 |
| Ex. 7 | 65 | 4 | Tapered | 20 | 1.0 |
| Ex. 8 | 75 | 5 | Tapered | 20 | 1.4 |
| Ex. 9 | 70 | 5 | Tapered | 20 | 1.0 |
| Ex. 10 | 90 | 6 | Tapered | 20 | 1.2 |
| Comp. Ex. 1 | 60 | 3 | Tapered | 2 | Bulging of plating |
| Comp. Ex. 2 | Not dissolved | — | — | 20 | 1.0 |
| Comp. Ex. 3 | Not dissolved | — | — | 20 | 1.0 |
| Comp. Ex. 4 | 65 | 2 | Undercut | 20 | 1.1 |
| Comp. Ex. 5 | 65 | 2 | Undercut | 20 | 1.1 |

Test methods

Dissolution time

There was measured a time up to when an unexposed adhesive composition was completely dissolved and removed.

Step No. according to Stouffer 21 step tablet test

A Stouffer 21-step tablet was placed on the laminate board coated with the adhesive composition, followed by light exposure. Then, development was conducted for a time length two times as long as the above dissolution time. A step number at which no surface deterioration was seen, was examined. (This test was not conducted in the case of no dissolution in developer.) A larger step number indicates better curability.

Via hole shape

The laminate board coated with the adhesive was exposed to light and then development was conducted for a time length two times as long as the above dissolution time, followed by curing. Then, the sectional shape of via hole was examined. (This test was not conducted in the case of no dissolution in developer.)

Soldering heat resistance after moistened

A multilayer printed circuit board produced was provided with an outer copper pattern of 10 mmϕ by etching. The resulting material was moistened for 1 hour using a saturated pressure cooker at 121° C. and then dipped in solder of 260° C. for 20 seconds. Time lengths up to when five samples were destructed, were measured and an average thereof was calculated.

Peeling strength

A multilayer printed circuit board produced was measured for peeling strength of copper plating by JIS C 6481.

As described above, the photosensitive adhesive composition for additive plating according to the present invention has high resolution; allows easy development of photo via holes with an aqueous alkali solution; nevertheless, has excellent resistance to plating solution, in electroless plating conducted for a long time under high-temperature and highly alkaline conditions; has high adhesivity to copper plating; and can withstand a temperature of about 260° C. employed in soldering. The multilayer printed circuit board obtained by a build-up process using the present photosensitive adhesive composition is superior in various properties and enables easy formation of photo via holes of good shape.

What is claimed is:

1. A photosensitive adhesive composition for additive plating comprising the following components (a), (b), (c), (d), (e) and (f) as essential components:

(a) a polyfunctional epoxy resin having an epoxy equivalent of 120–500, (b) a modified phenol novolac obtained by reacting 20–60 mole % of the phenolic hydroxyl groups of a phenol novolac obtained by condensing a phenol compound with formaldehyde in the presence of an acidic catalyst, with a glycidyl group-containing acrylate or methacrylate, (c) an epoxy acrylate or epoxy methacrylate compound, (d) a diluent consisting of a polyfunctional monomer having a plurality of photosensitive functional groups or a polyfunctional monomer having a photosensitive functional group and a heat-sensitive functional group, or a diluent consisting of a combination of the two monomers, (e) a photopolymerization initiator, and (f) an acid-soluble filler.

2. A photosensitive adhesive composition for additive plating comprising the following components (a), (b), (c), (d), (e) and (f) as essential components:

(a) a polyfunctional epoxy resin having an epoxy equivalent of 120–500, (b) a modified bisphenol novolac obtained by reacting 20–60 mole % of the phenolic hydroxyl groups of a bisphenol novolac obtained by condensing bisphenol A or F with formaldehyde in the presence of an acidic catalyst, with a glycidyl group-containing acrylate or methacrylate, (c) an epoxy acrylate or epoxy methacrylate compound, (d) a diluent consisting of a polyfunctional monomer having a plurality of photosensitive functional groups or a polyfunctional monomer having a photosensitive functional group and a heat-sensitive functional group, or a diluent consisting of a combination of the two monomers, (e) a photopolymerization initiator, and (f) an acid-soluble filler.

3. An adhesive composition according to claim 1, wherein the polyfunctional epoxy resin (a) is a bisphenol A or epoxy resin.

4. An adhesive composition according to claim 2, wherein the polyfunctional epoxy resin (a) is a bisphenol A or F epoxy resin.

5. An adhesive composition according to claim 1, wherein the modified phenol novolac (b) is obtained by reacting 40–50 mole % of the phenolic hydroxyl groups of a phenol novolac obtained by condensing a phenol compound with formaldehyde in the presence of an acidic catalyst, with glycidyl acrylate or glycidyl methacrylate.

6. An adhesive composition according to claim 1, wherein the epoxy acrylate or epoxy methacrylate compound (c) is obtained by reacting an epoxy compound selected from the group consisting a bisphenol A epoxy compound, a bisphenol F epoxy compound, a bisphenol S epoxy compound, a phenol novolac epoxy compound, a cresol novolac epoxy compound and an aliphatic epoxy compound, with acrylic acid or methacrylic acid.

7. An adhesive composition according to claim 2, wherein the epoxy acrylate or epoxy methacrylate compound (c) is obtained by reacting an epoxy compound selected from the group consisting of a bisphenol A epoxy compound, a bisphenol F epoxy compound, a bisphenol S epoxy compound, a phenol novolac epoxy compound, a cresol novolac epoxy compound and an aliphatic epoxy compound, with acrylic acid or methacrylic acid.

8. An adhesive composition according to claim 1, wherein the epoxy acrylate or epoxy methacrylate compound (c) is obtained by reacting the epoxy group of an epoxy compound selected from the group consisting of a bisphenol A epoxy compound, a bisphenol F epoxy compound, a bisphenol S epoxy compound, a phenol novolac epoxy compound, a cresol novolac epoxy compound and an aliphatic epoxy compound, with acrylic acid or methacrylic acid completely or partially and then reacting the reaction product with a dicarboxylic acid compound having an acid value of 5–100 selected from the group consisting of oxalic acid, malonic acid, succinic acid, glutamic acid, adipic acid, maleic acid, fumaric acid, phthalic acid and terephthalic acid, or with an acid anhydride thereof.

9. An adhesive composition according to claim 2, wherein the epoxy acrylate or epoxy methacrylate compound (c) is obtained by reacting the epoxy group of an epoxy compound selected from the group consisting of a bisphenol A epoxy compound, a bisphenol F epoxy compound, a bisphenol S epoxy compound, a phenol novolac epoxy compound, a cresol novolac epoxy compound and an aliphatic epoxy compound, with acrylic acid or methacrylic acid completely or partially and then reacting the reaction product with a dicarboxylic acid compound having an acid value of 5–100 selected from the group consisting of oxalic acid, malonic acid, succinic acid, glutamic acid, adipic acid, maleic acid, fumaric acid, phthalic acid and terephthalic acid, or with an acid anhydride thereof.

10. An adhesive composition according to claim 1, wherein the diluent (d) consisting of a polyfunctional monomer having a plurality of photosensitive functional groups is a compound having, in the molecule, at least two acryloyl or methacryloyl groups.

11. An adhesive composition according to claim 10, wherein the compound having, in the molecule, at least two acryloyl or methacryloyl groups is selected from the group consisting of trimethylolpropane triacrylate, pentaerythritol triacrylate and pentaerythritol tetraacrylate.

12. An adhesive composition according to claim 2, wherein the diluent (d) consisting of a polyfunctional monomer having a plurality of photosensitive functional groups is a compound having, in the molecule, at least two acryloyl or methacryloyl groups.

13. An adhesive composition according to claim 12, wherein the compound having, in the molecule, at least two acryloyl or methacryloyl groups is selected from the group consisting of trimethylolpropane triacrylate, pentaerythritol triacrylate and pentaerythritol tetraacrylate.

14. An adhesive composition according to claim 1, wherein the diluent (d) consisting of a polyfunctional monomer having a photosensitive functional group and a heat-sensitive functional group is an acrylate or methacrylate compound having at least one hydroxyl group in the molecule, or glycidyl acrylate or glycidyl methacrylate.

15. An adhesive composition according to claim 2, wherein the diluent (d) consisting of a polyfunctional monomer having a photosensitive functional group and a heat-sensitive functional group is an acrylate or methacrylate compound having at least one hydroxyl group in the molecule, or glycidyl acrylate or glycidyl methacrylate.

16. An adhesive composition according to claim 1, wherein the acid-soluble filler (f) is selected from the group consisting of calcium silicate, magnesium hydroxide and calcium carbonate.

17. An adhesive composition according to claim 2, wherein the acid-soluble filler (f) is selected from the group consisting of calcium silicate, magnesium hydroxide and calcium carbonate.

18. An adhesive composition according to claim 1, wherein the proportion of the acid-soluble filler (f) is 20–50 parts by weight per 100 parts by weight of the total of the components (a) to (d).

19. An adhesive composition according to claim 2, wherein the proportion of the acid-soluble filler (f) is 20–50 parts by weight per 100 parts by weight of the total of the components (a) to (d).

20. An adhesive composition according to claim 1, further comprising a heat-curing accelerator.

21. An adhesive composition according to claim 2, further comprising a heat-curing accelerator.

22. A photosensitive adhesive film for additive plating for use in production of a printed circuit board, obtained by coating a solution of the photosensitive adhesive composition for additive plating of claim 1 on a carrier film to convert the composition into a film.

23. A photosensitive adhesive film for additive plating for use in production of a printed circuit board, obtained by coating a solution of the photosensitive adhesive composition for additive plating of claim 2 on a carrier film to convert the composition into a film.

* * * * *